(12) United States Patent  (10) Patent No.: US 9,111,643 B2
Pan et al.  (45) Date of Patent: Aug. 18, 2015

(54) METHOD AND APPARATUS FOR REPAIRING DEFECTIVE MEMORY CELLS

(71) Applicant: Semiconductor Manufacturing International (Shanghai) Corporation, Shanghai (CN)

(72) Inventors: Jindong Pan, Beijing (CN); Amy Wei, Beijing (CN); Yan Ding, Beijing (CN); Jing Zhang, Beijing (CN); Michael Fang, Beijing (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 132 days.

(21) Appl. No.: 13/928,233

(22) Filed: Jun. 26, 2013

(65) Prior Publication Data

US 2014/0241084 A1 Aug. 28, 2014

(30) Foreign Application Priority Data

Feb. 26, 2013 (CN) .......................... 2013 1 0060639

(51) Int. Cl.
*G11C 7/00* (2006.01)
*G11C 29/04* (2006.01)
*G11C 29/00* (2006.01)

(52) U.S. Cl.
CPC .............. *G11C 29/04* (2013.01); *G11C 29/808* (2013.01)

(58) Field of Classification Search
CPC ............................ G11C 29/808; G11C 29/785
USPC .............................................. 365/200, 189.02
See application file for complete search history.

(56) References Cited

U.S. PATENT DOCUMENTS 5,933,376 A * 8/1999 Lee ................................ 365/200
6,671,834 B1 * 12/2003 Zhu et al. ...................... 714/711

* cited by examiner

*Primary Examiner* — Son Dinh
(74) *Attorney, Agent, or Firm* — Kilpatrick Townsend and Stockton LLP

(57) ABSTRACT

A method for repairing defective memory cells includes receiving an access command having an access address and an access operation. The access address includes a row address and a column address. The method further includes determining whether the row address and the column address are the same as a pre-recorded row address and column address of a defective memory cell. If the row and column addresses of the access address are the same as the respective row and column addresses of the defective memory cell, the method includes replacing the defective memory cell with a redundant memory cell, and executing the access operation using the redundant memory cell.

16 Claims, 5 Drawing Sheets

METHOD AND APPARATUS FOR REPAIRING DEFECTIVE MEMORY CELLS

CROSS-REFERENCES TO RELATED APPLICATIONS

This application claims priority to Chinese Patent Application No. 201310060639.4, filed Feb. 26, 2013, entitled "Method and Apparatus for Repairing Defective Memory Cells," commonly assigned and incorporated, herein by reference in its entirety.

BACKGROUND OF THE INVENTION

The present invention relates to integrated circuits (IC) and, more particularly to repairing defective memory cells in such ICs.

As ICs continue to include more transistors, static random memory has become increasingly important in storing and retrieving data in digital integrated circuits. Since a static random access memory (referred to as an SRAM) does not require refresh operations, the SRAM is widely used in high speed applications such as high-speed buffer memory and other storage systems.

In recent years, SRAMs have been widely used in mobile phones, computers and other portable devices. In the production process of an SRAM, due to unavoidable environment and process variations, defective memory cells affect the production yield. Therefore, SRAM devices generally include a number of redundant memory cells used to replace defective memory cells in order to improve yield.

These redundant memory cells are designed the same way and operate in the same fashion as the memory cells in a memory device, but increase the silicon area. Under normal operating conditions of a memory device, these redundant memory cells are not accessible (i.e., they cannot be read or written). Their only role is to replace memory cells that do not operate properly. In other words, the redundant memory cells waste silicon real estate if all other memory cells are operating correctly, i.e., when the memory device does not have any defective memory cells.

It has been found that repairing individual memory cells is not economical. Conventionally, when certain memory cells are detected to be not properly accessible or operational (whether in read or write mode), the defective memory cells are replaced by the redundant memory cells that are addressed by the respective row or column addresses of the defective memory cells. For example, when a defect in memory cell A is detected, the row address of defective memory cell A will be recorded. When a read operation is performed on memory cell A, the row address contained in the read command is compared with the recorded row address of the defective memory cell A. If the row address in the read command and the recorded address are the same, the row address contained in the read operation is replaced by the row address of a redundant memory cell. Thus, a read operation to a defective memory cell will result in the read operation of the redundant memory cell having the row address associated with the row address of the defective memory cell. However, this repair scheme will cause non-defective memory cells sharing the same row address to also be replaced, thus, limiting the number of repairable defective memory cells.

Therefore, there is a need for a method and apparatus for effectively repairing defective memory cells.

BRIEF SUMMARY OF THE INVENTION

Embodiments of the present invention provide advantages and benefits of an effective use of a redundant row that can be used to repair multiple defective memory cells located in different rows or different columns. According to one embodiment of the present invention, a method for repairing a memory cell comprises receiving an access command, which may include an access address having a row address and a column address and an access operation, and determining whether the row address and column addresses of the access address are the same as respective pre-recorded row and column addresses of a defective memory cell. If the row and column addresses of the access address are the same as the respective row and column addresses of the defective memory cell, the method includes finding a redundancy memory cell associated with the defective memory cell in response to the access address, and executing the access operation with the redundancy memory cell.

In an embodiment, prior to receiving the access command and after detecting the defective memory cell, the method further comprises recording the ow address and column address of the defective memory cell, and establishing a mapping relationship between the row address and column addresses of the defective memory cell and the row address and column addresses of the redundant memory cell.

In an embodiment, establishing the mapping relation comprises selecting a redundant memory cell from a redundant row of redundant memory cells that have not been used in a mapping relationship with any one of the defective memory cells, and mapping the row address of the defective memory cell to a row address of the selected redundant memory cell and mapping the column of the defective memory cell with a column address of the selected redundant memory cell.

In an embodiment, the column address of the selected redundant memory cell is the same as the column address of the defective memory cell.

In an embodiment, the column addresses of the selected redundant memory cell is the smallest or the largest column address of the redundant memory cells in the redundant row.

In an embodiment, a redundant memory cell can be selected from a plurality of redundant rows, each of the redundant rows has multiple redundant cells, and each redundant cell on a redundant row has a different column address.

In an embodiment, the access operation includes a read operation and/or a write operation.

An embodiment of the present invention provides an apparatus for repairing defective memory cells. The apparatus may include, in part, a receiving unit configured to receive an access command. The access command may include an access address having a row address and a column address and an access operation. The apparatus also includes a determining unit configured to determine whether the row address and the column address of the access address are the same as a pre-recorded row address and a pre-recorded column address of a defective memory cell, respectively. The apparatus further includes an executing unit configured to find a redundant memory cell in response to the access memory after determining that the row and column addresses of the access address are the same as the pre-recorded row and column addresses of the defective memory cell, and execute the access operation with the found redundant memory cell.

In an embodiment, the apparatus further comprises a setup unit configured to detect the defective memory and record the row and column addresses of the defective memory cell that has be detected.

In an embodiment, the setup unit includes a selecting module configured to select from a plurality of redundant rows a redundant memory cell that has not yet been established a mapping relationship with any one of a multitude of defective memory cells. Each one of the redundant rows may include a plurality of redundant memory cells. Each one of the redundant memory cells on the same redundant row has a different column address. The setup unit further include a setup module configured to establish a mapping relationship between the row address and the column address of the defective memory cell and a respective row address and a respective column address of the selected redundant memory cell.

In accordance with an embodiment of the present invention, a volatile memory device includes an array of memory cells arranged into a number of rows and a number of columns and partitioned into a plurality of groups of memory cells, each group including a plurality of redundant memory cells arranged in a number of redundant columns. The volatile memory device also includes an address decoding unit configured to decode received address data and select a row of memory cells in response to a decoded address, a plurality of multiplexers, each one is coupled to one of the plurality of groups, and a column address re-allocation unit configured to replace a column address of a defective memory cell with one column address of the plurality of redundant memory cells.

Embodiments of the present invention provide many advantages and benefits of an effective use of redundant memory cells. In an embodiment, there is a one-to-one remapping relationship between a defective memory cell and a redundant memory cell. In other words, embodiments of the present invention enable a repair of a number of defective memory cells with a number of redundant memory cells that is substantially equal to the number of the defective memory cells. In contrast, conventional art requires a row having one defective memory cell be replaced by an entire redundant row, although other memory memory cells on the row are not defective. Similarly, conventional art requires that a column having one defective memory cell be replaced with an entire redundant column, although all other memory cells on the same column are operational (i.e., non-defective). Therefore, embodiments of the present invention provide improved resource utilization.

BRIEF DESCRIPTION OF THE DRAWINGS

The foregoing and further advantages of the present invention will become readily apparent to those of skill in the art from the following detailed description taken in conjunction with the following drawings, in which.

DETAILED DESCRIPTION OF THE INVENTION

Figure 1:
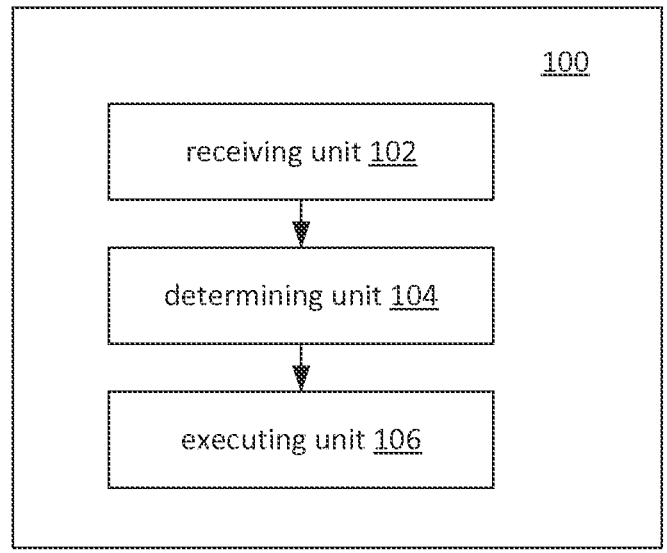
FIG. 1 is a simplified block diagram of an exemplary apparatus for repairing defective memory cells according to an embodiment of the present invention.

In the drawings, the same reference numerals refer to the same elements. As used herein, the term "block", "module", or "unit" may be formed of analog circuits, digital circuits, or a combination thereof to achieve a hardware configuration. In some embodiments, the term "block", "module", or "unit" can also be executed with one or more processing units together with a computer readable medium and/or software program codes.

In the following, a memory device may be an SRAM including a plurality of memory cells organized in rows and columns. A row of memory cells includes a word line and all of the memory cells in a row are coupled to the word line. A column of memory cells includes a bit line or a bit line pair. In other embodiments, the column lines can be word lines and the row lines can be bit lines. Note that the memory device also includes row and column decoders, sense amplifiers, and other peripheral circuitry used to access the memory device. In an embodiment, the memory device is a SRAM device.

First Embodiment

FIG. 1 is a simplified block diagram of an exemplary apparatus 100 for repairing defective memory cells according to an embodiment of the present invention. As shown in FIG. 1, apparatus 100 includes a receiving unit 102, a determining unit 104, and an executing unit 106. The units will be described in detail below.

In an embodiment, receiving unit 102 is configured to receive an access command. The access command may include an access address and an access operation. In an embodiment, the access address may comprise a row address and a column address of the memory cell to be accessed. The access operations may include, but not limited to, a read operation and/or a write operation. For example, the access command may indicate that data stored in a memory cell having row address RA and column address CA to be read.

Determining unit 104 is coupled to receiving unit 102 and is configured to determine whether the row address and the column address of the access address are the same as a prerecorded row address and column address of a defective memory cell, respectively.

For example, assume the row address and column address of a defective memory cell 1 is XA1A0=n01, wherein X represents the row address, and A1A0 represents the column address. Defective memory cell 2 has a row address and a column address of XA1A0=m01. After receiving unit 102 receives an access command, determining unit 104 determines whether the access address in the access command is n01 or m01 associated with the defective memory cells.

Executing unit 106 is coupled to determine unit 104. In response to the determination that the current access address is associated with a defective memory cell, executing unit 106 finds a redundant memory cell that is associated with the defective memory cell and executes the access operation using the found redundant memory cell.

In an embodiment, a specific defective memory cell is replaced with a selected redundant memory cell, rather than replacing the entire row or entire column that has a defective memory cells (including the non-defective memory cell(s)) with a redundant row or a redundant column. Accordingly, the address of a selected redundant memory cell includes a row address and a column address. The access operation can be directly executed through the row and column addresses of the selected redundant memory cell. For example, the access operation may include a read operation from the selected redundant memory cell. In an embodiment, the address of the redundant memory cell can be determined according to a pre-determined index or flag.

In one embodiment, one of the following methods can be employed for replacing defective memory cells with redundant memory cells. One method is to use a redundant memory cell to replace a defective memory cell. Another method is to use a group of redundant cells to replace the defective memory cells. For example, if eight memory cells are used to store one data word, when one or more of the eight memory cells are defective, eight redundant memory cells are used to replace the eight memory cells. The above-mentioned methods serve only as example, other alternatives and modifications may also be used, e.g., by replacing a two-bytes word or four-bytes word as a word unit.

In the embodiments described above, the repair of a defective memory cell is through re-mapping of the row and column addresses of the defective memory cell without having to remap all of memory cells located on the same row or column of the defective memory cell. In contrast, conventional memories require that all memory cells on the row and column addresses be remapped to the row or column of the redundant cell. In other words, conventionally the non-defective memory cells are also replaced with the redundant memory cells in the redundant row or column, thus, wasting resources of the entire redundant row or entire redundant column. Embodiments of the present invention enable a one-to-one replacement of defective memory cells to improve resource utilization.

Figure 2:
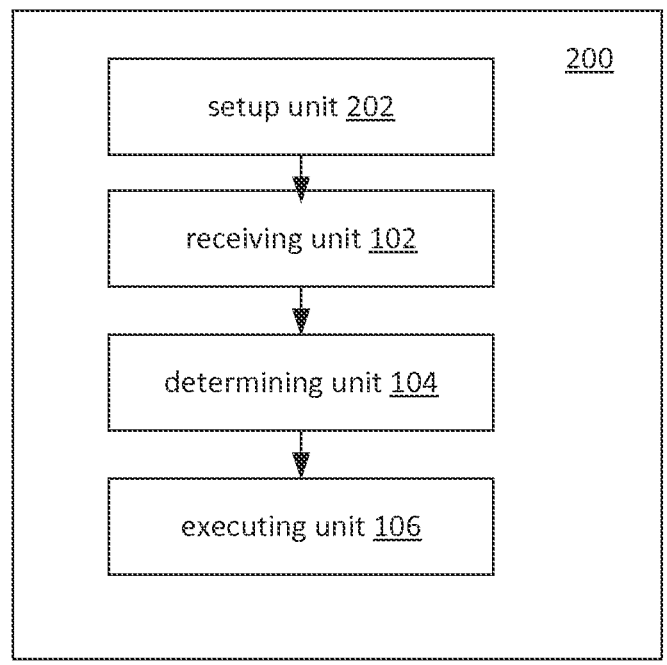
FIG. 2 is a simplified block diagram of an exemplary apparatus for repairing defective memory cells according to another embodiment of the present invention.

In an embodiment, in order to find a corresponding redundant memory cell to replace the defective memory cell, a mapping relationship between the address of the redundant memory cell and the address of defective memory cell is established. In accordance with FIG. 2, exemplary apparatus 200 is shown as further including a setup unit 202 configured to verify or test each memory cell in the memory device and record the row address and column address of each memory cell that is found to be defective (i.e., not being able to be written to or read from). Setup unit 202 also establishes a mapping relationship between the row and column addresses of the defective memory cells and the row and column addresses of corresponding redundant memory cells. The testing of the memory cells and the mapping relationship are performed prior to receiving an access command by receiving unit 102. In other words, setup unit 202 may be placed ahead of receiving unit 102, as shown in FIG. 2.

Figure 3:
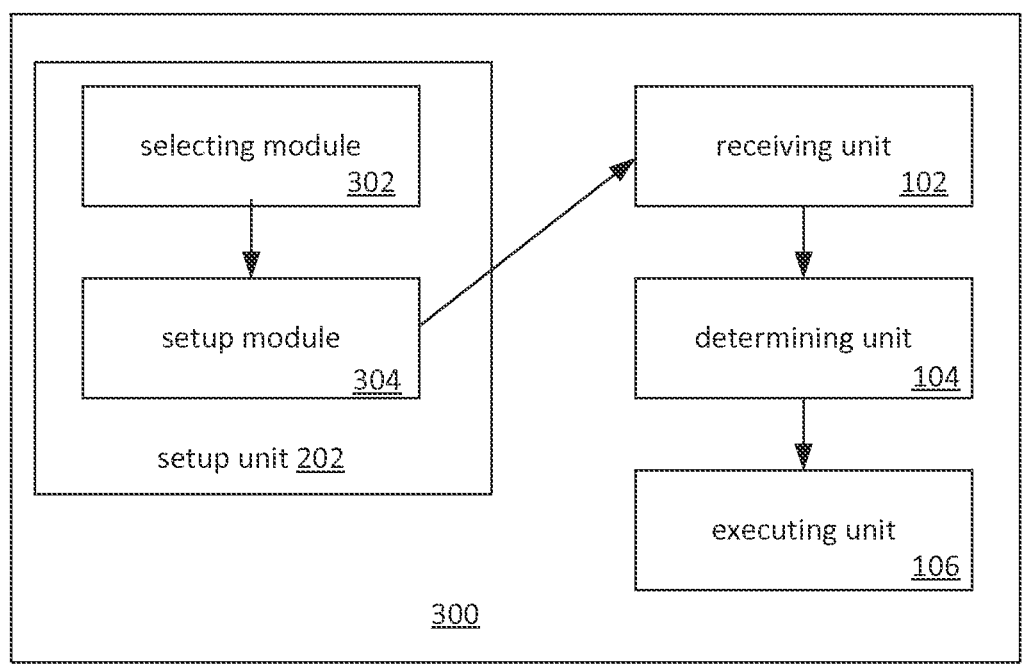
FIG. 3 is a simplified exemplary apparatus for repairing defective memory cells according to yet another embodiment of the present invention.

In order to form a one-to-one mapping relationship between a redundant memory cell and a defective memory cell, setup unit 202 may include a selecting module 302 and a setup module 304, as shown in FIG. 3. Selecting module 302 is configured to select from a row having multiple redundant memory cells a redundant memory cell that has not yet been used to replace a defective memory cell to form a mapping relationship with the defective memory cell. Each redundant memory cell on the row has the same row address, but different column address.

In an embodiment, a flag can be used to indicate whether a redundant memory cell has been used to establish a mapping relationship with a defective memory cell. For example, the flag can include one bit ("0" or "1"). When the flag is set to 1, it indicates that the redundant memory cell has established a mapping relationship with a defective memory cell. When the flag is set to 0, it indicates that the redundant memory cell does not have established a mapping relationship with a defective memory cell. The use of a flag is merely an example. A person skilled in the art would understand that other means can also be used to indicate whether or not a mapping relationship has been established between a redundant memory cell a defective memory cell.

Selecting module 302 may select any one of the redundant memory cells from the redundant memory cell row that has a "0" flag for establishing a mapping relationship with a defective memory cell. Setup module 304 is configured to establish a mapping relationship between the row address and the column address of a defective memory cell and the respective row and column addresses of the selected redundant memory cell.

In an embodiment, the mapping relationship between a redundant memory cell and a defective memory cell is a mapping relationship between the row and column addresses of the redundant memory cell and the row and column addresses of the defective memory cell, respectively.

In one embodiment, the mapping relationship keeps the column address of the selected redundant memory cell the same as the column address of the defective memory cell. In another embodiment, the redundant memory cell is selected to have the smallest or the largest column address in the redundant memory row that is available for mapping. In other words, a redundant cell in the redundant cell row with the next smallest or the largest column address that has not been used for establishing a mapping relationship with a defective memory cell will be selected as the next redundant cell for mapping with a next defective memory cell.

In an embodiment, apparatus 100 (see FIG. 1) can be provided with multiple redundant rows, each redundant row having a plurality of redundant memory cells. A redundant memory cell can be selected from the multiple redundant rows to establish a mapping relationship with a defective memory cell. In one embodiment, selecting a redundant memory cell from a redundant row that has not been used to establish a mapping relationship with a defective memory cell includes selecting one redundant row from multiple redundant rows, and further selecting a redundant cell of the selected redundant row.

Second Embodiment

Figure 4:
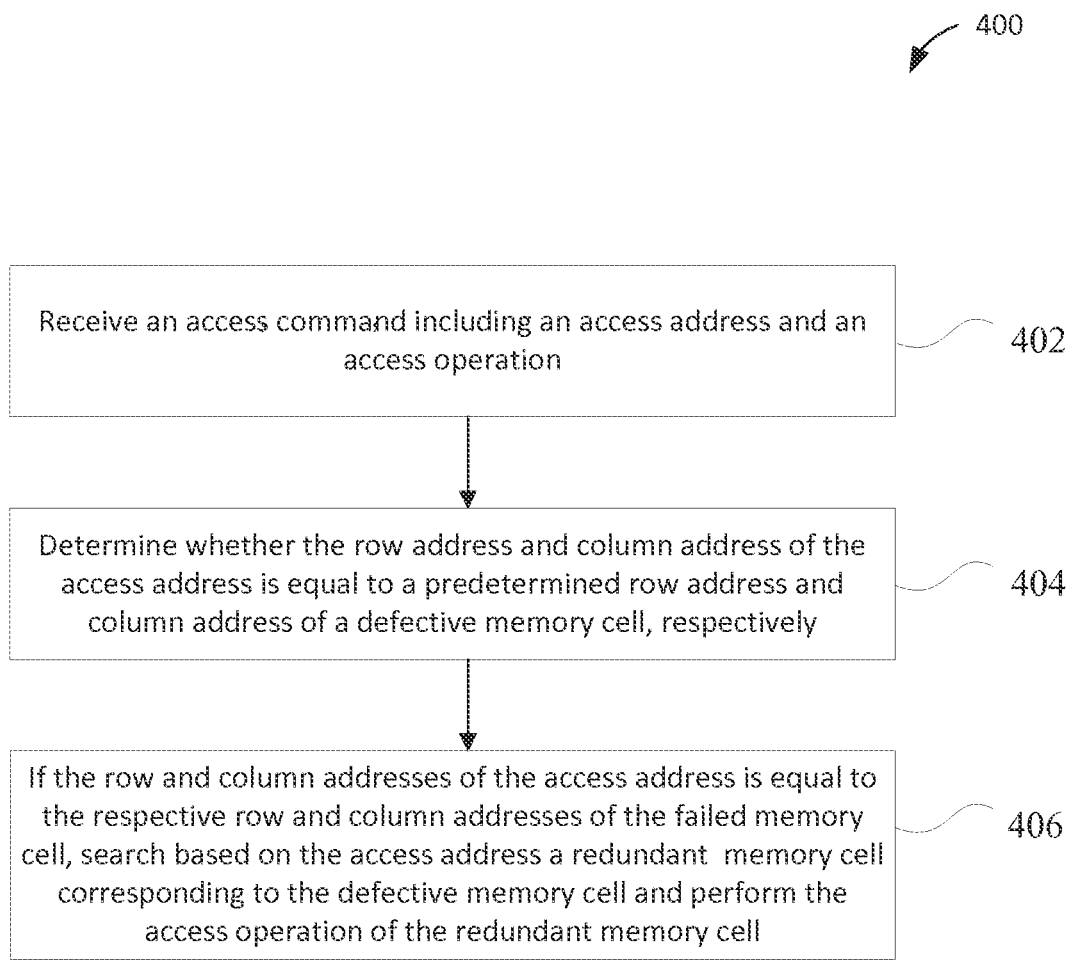
FIG. 4 is a flowchart diagram of a method for repairing defective memory cells according to an embodiment of the present invention.

An exemplary method for repairing defective memory cells will be described below with references to FIGS. 1 through to 3. FIG. 4 shows a flowchart 400 for repairing defective memory cells according to an embodiment of the present invention. At 402, an access command is received. The access command includes an access address and an access operation. For example, receiving unit 102 receives an access command to read data from a memory cell.

In an embodiment, the access address includes a row address and a column address of a memory cell to be accessed. The access command may include, in part, a read operation and/or a write operation. For example, the access command may indicate that data is read from the row address RA and column address CA of a memory cell.

At 404, it is determined whether the row address and the column address of the access address are the same as the respective pre-recorded row address and column address of a defective memory cell.

For example, assume the pre-recorded row address and column address of defective memory cell 1 is XA1A0=n01, wherein X represents a row address, and A1A0 represents the column address. Defective memory cell 2 has a row address and a column address of XA1A0=m01. After receiving the access command, determining unit 104 determines whether the access address in the access command is n01 or m01. If the access address is determined to be either n01 or m01, determining unit 104 determines that the current access command is addressing a defective memory cell.

At 406, if the row address and column address of the access address are the same as the respective row address and column address of the defective memory cell, executing unit 106 searches for and finds a corresponding redundancy memory cell based on the access address, and performs the access operation on the redundancy memory cell.

In an embodiment, the method for repairing a defective memory cell includes remapping the row address and the column address of the defective memory cell without having to remap all memory cells on the same row or all memory cells on the same column as is done in conventional systems. In accordance with one embodiment of the present invention, determining the address of a redundant memory cell includes performing the access operation through a direct addressing of the row address and column address of the redundant memory cells, for example, by reading data from the redundant memory cell. In an embodiment, the address of the redundant memory cell can be determined according to a pre-determined index. In an embodiment, the method for repairing a defective memory cell includes remapping the row address and the column address of the defective memory cell without having to remap all memory cells on the same row or all memory cells on the same column as is done in conventional systems. In accordance with one embodiment of the present invention, determining the address of a redundant memory cell includes performing the access operation through a direct addressing of the row address and column address of the redundant memory cells, for example, by reading data from the redundant memory cell. In an embodiment, the address of the redundant memory cell can be determined according to a pre-determined index.

In an embodiment, replacing a defective memory cell with a corresponding redundant memory cell may be performed using one of the following ways: 1) using a redundant memory cell to replace a defective memory cell; 2) using redundant memory cells in a word unit to replace defective memory cells. For example, if eight memory cells store one word of data, when one or more of the eight memory cells are defective, eight redundant memory cells are used to replace the eight memory cells.

In the embodiments described above, repairing of defective memory cells includes remapping of the row and column addresses of the defective memory cell without having to remap all memory cells located on a row or on a column of the defective memory cell required in conventional art. Embodiments of the present invention thus enable a more efficient use of redundant memory cells and achieve better resource utilization.

Figure 5A:
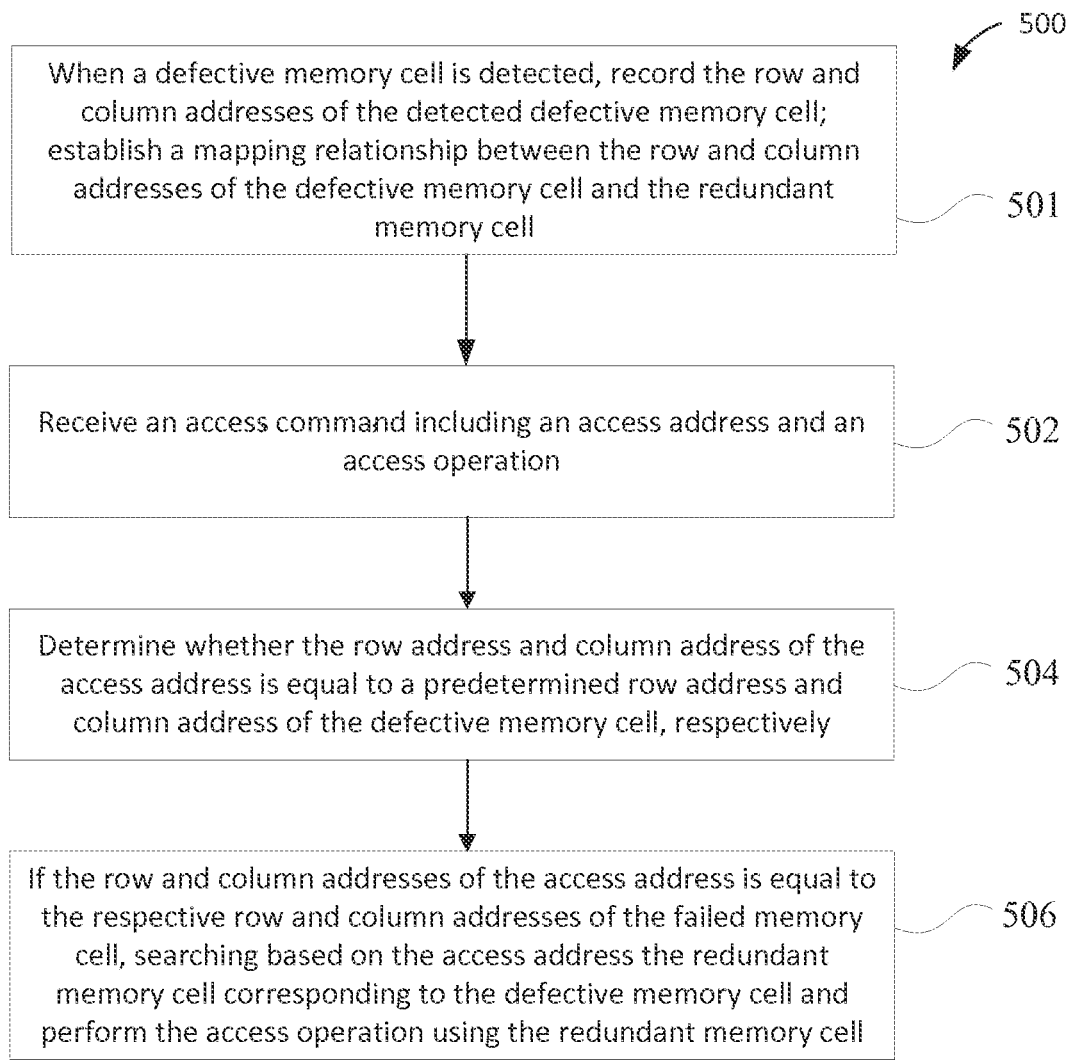
FIG. 5A is a simplified exemplary apparatus for repairing defective memory cells according to an embodiment of the present invention.

In an embodiment, in order to find a corresponding redundant memory cell for the defective memory cell, a mapping relationship may be established between the address of the redundancy memory cell and the address of defective memory cell. FIG. 5A shows a simplified flow chart 500 for repairing defective memory cells according to an embodiment of the present invention. As shown, at 501, setup unit 202 (see FIG. 2) verifies and tests each memory cell contained in a memory device. The testing of the memory cells can be performed sequentially row by row or column by column. When a defective memory cell is detected, setup unit 202 records a row address and a column address associated with the defective memory cell, and establishes a mapping relationship between the row address and column address of the defective memory cell and a row address and a column address of a redundant memory cell, respectively.

At 502, an access command is received. The access command includes an access address and an access operation. The access address includes a row address and a column address of a memory cell to be accessed. The access command may include, in part, a read operation and/or a write operation. For example, the access command may indicate that data is read from the row address RA and column address CA of a memory cell.

At 504, it is determined whether the row address and the column address of the access address are the same as the respective pre-recorded row address and column address of a defective memory cell. For example, assume the pre-recorded row address and column address of defective memory cell 1 is XA1A0=n01, wherein X represents a row address, and A1A0 represents the column address. Defective memory cell 2 has a row address and a column address of XA1A0=m01. After receiving the access command, determining unit 104 determines whether the access address in the access command is n01 or m01. If the access address is determined to be either n01 or m01, determining unit 104 determines that the current access command is addressing a defective memory cell.

At 506, if the row address and column address of the access address are the same as the respective row address and column address of the defective memory cell, executing unit 106 searches for and finds a corresponding redundancy memory cell based on the access address, and performs the access operation on the redundancy memory cell. In an embodiment, the method for repairing a defective memory cell includes remapping the row address and the column address of the defective memory cell without having to remap all memory cells on the same row or all memory cells on the same column as is done in conventional systems. In accordance with one embodiment of the present invention, determining the address of a redundant memory cell includes performing the access operation through a direct addressing of the row address and column address of the redundant memory cells, for example, by reading data from the redundant memory cell. In an embodiment, the address of the redundant memory cell can be determined according to a pre-determined index. In an embodiment, the method for repairing a defective memory cell includes remapping the row address and the column address of the defective memory cell without having to remap all memory cells on the same row or all memory cells on the same column as is done in conventional systems. In accordance with one embodiment of the present invention, determining the address of a redundant memory cell includes performing the access operation through a direct addressing of the row address and column address of the redundant memory cells, for example, by reading data from the redundant memory cell. In an embodiment, the address of the redundant memory cell can be determined according to a pre-determined index.

Figure 5B:
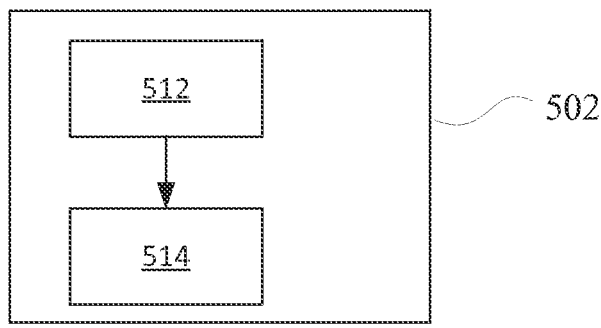
FIG. 5B is a simplified subsystem of the embodiment shown in FIG. 5A.

In one embodiment, in order to ensure a one-to-one mapping relationship between the row address and column address of the defective memory cell and the row address and the column address of the redundancy memory unit, the mapping relationship may be established using the following steps, as shown in FIG. 5B. At 512, a redundant memory cell is selected from a row of redundant memory cells that has not yet established a mapping relationship with any defective memory cell. The redundant memory cells positioned on the same row address have different column addresses.

In an embodiment, a flag can be used to indicate whether the redundant memory cell has been used to establish a mapping relationship with a defective memory cell. For example, when the flag bit is 1, it indicates that the redundant memory cell has established a mapping relationship with a defective memory cell. Conversely, if the flag is 0, it indicates that the redundant memory cell has not been used to establish the mapping relationship with a defective memory cell. Of course, the above-described flag for indicating whether a redundant memory cell has established a mapping relationship with a defective memory cell is just an example, a person skilled in the art would appreciate that other indication means could also be used to indicate whether or not a redundant cell has been used for mapping with a defective memory cell.

For example, in an embodiment, it is possible to select from a row of redundant memory cells one redundant memory cell having a flag bit set to 0 to establish a mapping relationship with a defective memory cell.

At 514, a mapping relationship is established between the row and column addresses of a defective memory cell and the row and column addresses of a selected redundant memory cell.

In an embodiment, establishing a mapping relationship between a redundant memory cell and a defective memory cell includes establishing a mapping relationship between the row and column addresses of the defective memory cell and the row and column addresses of the redundant memory cell, respectively.

In an embodiment, the column address of the selected redundant memory cell is the same as the column address of the defective memory cell. In another embodiment, the column address of the selected redundant memory cell is the smallest column address or the largest column address of the a redundant memory cell in the redundant row that has not yet been used for establishing a mapping relationship with a defective memory cell.

In an embodiment, apparatus 200 or 300 may include a plurality of redundant rows, each having a plurality of redundant memory cells. The redundant memory cells can be selected from the plurality of redundant rows in order to establish mapping relationships with defective memory cells. In one embodiment, selecting an available redundant cell from the redundant rows includes a selection of one redundant memory cell that has not been used for mapping from the plurality of redundant rows.

Third Embodiment

In accordance with the third embodiment, when a defective memory cell address has been detected, the complete address of the defective memory cell (including a row address and a column address) is recorded. A redundant memory cell is selected (from a plurality of redundancy memory cells) to replace the defective memory cell, while a mapping relationship between the address of the defective memory cell and the address of the redundant memory cell is concurrently recorded. When a read or write operation is performed for the second time to the defective memory cell, the read or write operation will be executed on the corresponding redundancy memory cell using the mapping relationship.

Figure 6:
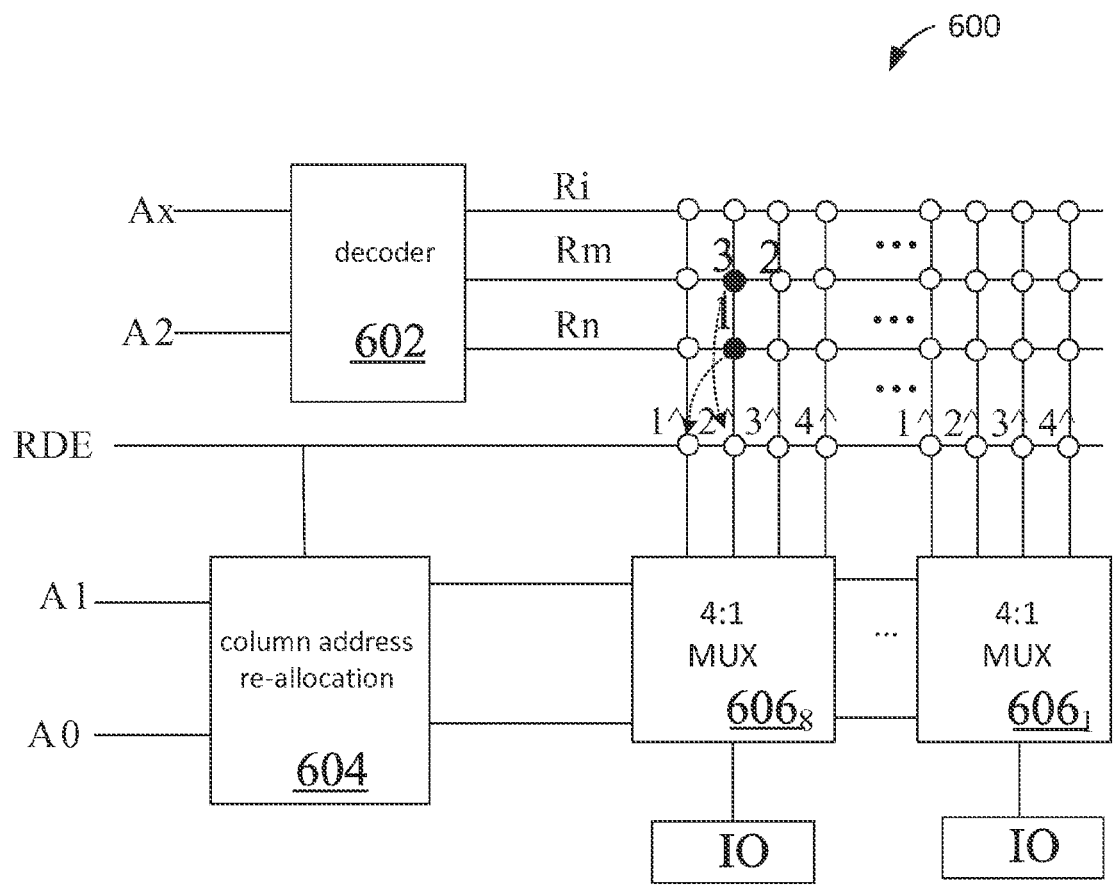
FIG. 6 is a simplified schematic diagram of an exemplary embodiment of an SRAM structure according to an embodiment of the present invention.

FIG. 6 shows a partial memory structure 600 according to another embodiment of the present invention. In this Figure, the column address is represented by two bits A1, A0 of the memory structure. In an embodiment, memory structure 600 may be a SRAM including a row address decoder 602 configured to decode addresses lines A2 through Ax, a column address re-allocation unit 604, and a plurality of 4:1 multiplexers 606. In an embodiment, decoder 602, column address re-allocation unit 604, and 4:1 multiplexers 606 together are configured to perform the functions of executing unit 106 in the above-described embodiments. In an embodiment, SRAM structure 600 may also include one or more processing units or control units to perform the functions of receiving unit 102, determining unit 104. Decoder 602, column address re-allocation unit 604, and 4:1 multiplexers 606, and processing and control units (not shown) operate together to perform functions of apparatuses 100, 200, and 300, as shown in respective FIGS. 1, 2, and 3.

Referring to FIG. 6, memory cells are disposed at the intersection of a horizontal line and a vertical line. Each memory cell is marked by a circle. A white circle represents a non-defective memory cell, and a black circle represents a defective memory cell that has been detected. In this Figure, a horizontal line represents a row, a row line, or a row address of the SRAM structure. The vertical line represents a bit line or a bit line pair. The lines (row line, column line) of the redundant memory cells have the same structure as the row lines and column lines of the memory structure. In an exemplary embodiment, three row (word lines) lines Ri, Rm, and Rn are shown for the memory cells, and only one word line (Word Line) marked as RDE is shown for the redundant memory cells.

As shown in FIG. 6, each row (e.g., Ri, Rm, Rn, and RDE line, wherein the RDE row is a redundant row having multiple redundant memory cells) has 32 memory cells, divided into eight groups, each group having four memory cells (marked as 1^, 2^, 3^, 4^), each group of four memory cells is coupled to one of the 4:1 multiplexers, the eight 4:1 multiplexers $606_1$ through $606_8$ receive the same control signals from column address re-allocation unit 604, and each of them outputs a bit of a memory cell to an IO port. Assume the stored data words are "10000000" and "00000001", select via the 4:1 multiplexer the second memory cell (2^) of each group in the Rn line to store the bits "10000000" and select via the 4:1 multiplexer the third memory cell (3^) of each group in the Rn line to store the bits "00000001".

If the bit "1" of the data word "10000000" in row Rn is detected to be stored in a defective memory cell, apparatus 100, 200, or 300 will replace the second memory cell in each of the eight groups in the Rn row with eight (8) redundant memory cells in a redundant line (row) indicated by "RDE" without the need to replace all 32 memory cells in the Rn line (row). That is, the replacement includes establishing a mapping relationship between the address of the redundant memory cells and the address of the defective memory cell (including the row address and column address). When the defective memory cell is accessed, the access operation is executed by the associated redundancy cell by means of the mapping relationship.

After establishing the mapping relationship between each defective memory cell and a corresponding redundant memory cell, when receiving unit 102 receives an access command, which includes an access address for addressing data "10000000" stored a memory cell having an address XA1A0=n01, wherein X represents the row address, A1A0 represents the column address. Column address re-allocation unit 604 will convert the column address "01" (i.e., the second memory cell in each group of the redundant memory row) in the access command to "00" (i.e., the first memory cell in each group of the redundant memory row) in accordance with the established mapping relationship, and apply the converted column address 00 to the eight 4:1 multiplexers 606. The eight 4:1 multiplexers 606 then select the first memory cell in each of the eight groups to output to the IO ports.

The function of column address re-allocation unit 604 will be further described below. In an embodiment, the pre-recorded row address and column address of defective memory cell 1 (indicated as black circle in row Rn of FIG. 6) is XA1A0=n01, and the row and column addresses of defective memory cell 3 in row Rm (indicated as black circle in FIG. 6) is XA1A0=m01, wherein X represents the row address, and A1A0 represents the column address.

When RDE is valid, indicating that the column address of the defective memory cell can be reallocated, the column address of the selected redundant memory cell on the row line RDE is different from the column address of the defective memory cell. For example, with regard to the defective memory cell 1, the defective memory cell 1 can have a mapping relationship with the first one of the four redundant memory cells of the RDE row (i.e., memory cell 1 ^). With regard to the defective memory cell 3, the defective memory cell 3 can have a mapping relationship with the second redundant memory cell of the RDE row (i.e., the memory cell 2 ^).

The above mapping relationship will be described as follows: The address of the defective memory cell 1 is XA1A0=n01. Because the memory cell 1 is defective, so RDE is set to 1, and a redundant memory cell is selected from the RDE row to replace the defective memory cell 1. Referring to FIG. 6, redundant memory cell at 1^ on the RDE row has a mapping relationship with the defective memory cell 1, so that the column address of the defective memory cell 1 is mapped to the A1A0=00, and the row address of the defective memory cell 1 is mapped to the $X=R_{RDE}$, wherein $R_{RDE}$ is the row address of the redundant cells. Thus, the first memory cell of each group of the redundant row has a mapping relationship with the second memory cell in each group of the Rn row.

The address of the defective memory cell 3 is XA1A0=m01. Because the memory cell 3 is defective, so RDE is set to 1, and a redundant memory cell is selected from the redundant memory row to replace the defective memory cell 3. Referring to FIG. 6, redundant cell at 2^ on the RDE row has a mapping relationship with the defective memory cell 3, so that the column addresses of the defective memory cell 3 is mapped to A1A0=01, and the row address of the defective memory cell 3 is mapped to the $X=R_{RDE}$, wherein $R_{RDE}$ represents the RDE row. Thus, the second memory cell in each group of the redundant row has a mapping relationship with the second memory cell in each group of the Rm row.

Additionally, the address of the memory cell 2 in the Rm line is XA1A0=m10. Because the memory cell 2 is non-defective, so the RDE is set to 0, so the non-defective memory cell 2 in row Rm is not replaced by a redundant memory cell.

In the exemplary embodiment shown in FIG. 6, the redundant memory cells are described as to be in one RDE row. It is noted that multiple redundant rows are possible. For example, if n rows of redundant memory cells are available, embodiments of the present invention can then repair n*y defective memory cells, wherein y is the number of bits (or memory cells) on a column address.

According to the above embodiments, benefits and advantages of the present invention can be summarized as follows: defective memory cells can be replaced by redundant memory cells through remapping of the row address and column address so that a number of defective memory cells may be replaced by the same number of redundant memory cells. In contrast, conventional repair techniques require that, if a defective memory cell is detected, the defect is repaired by replacing the row line affected with an entire redundant row line, or the defect is repaired by replacing the column line affected by an entire redundant column line. In accordance with the present invention, a redundant row line having a number of redundant memory cells can replace the same number of defective memory cells, or a redundant column line having a number of redundant memory cells can replace the same number of defective memory cells. Therefore, embodiments of the present invention improve resource utilization of a memory device significantly.

Benefits and advantages and solutions to problems have been described above with regards to specific embodiments. It should be noted that, while embodiments herein have been described with regards to particular hardware components and/or configurations, certain elements and/or features may alternatively be executed by software instructions performed on a microprocessor, microcontroller, or the like, located either in the same memory device or external to the memory device, without departing from the scope of the invention. For example, a processing unit (i.e., a microprocessor, a microcontroller, or a computer integrated in the memory device or external to the memory device) may be programmed to sequentially test each memory cell of the memory device. The sequential test may be performed row-wise starting with address 0. As soon as a defective memory cell is detected, the processing unit will identify the row address and column address of the defective memory cell and replace the defective memory cell with a redundant memory cell. The processing unit may re-allocate the row and column addresses of the defective memory cell to different row and column addresses of the redundant memory cell. In some embodiments, each redundant memory cell may have been associated with a flag that indicates whether a specific redundant memory cell is available to replace a defective memory cell.

The methods and apparatuses described herein are not limited to a particular hardware or software configuration, and may be applicable in many computing or processing environments. The methods and apparatuses may be implemented in a personal computer such as laptop, tablet, or in a handheld device such as a cellular phone, smartphone, or the like. Accordingly, the methods and apparatuses provided herein are not exhaustive and are provided for illustration and not limitation.

While various embodiments of the present invention have been described above, it should be understood that they have been presented by way of example only, and not limitation. It will be apparent to persons skilled in the art that various changes in form and detail can be made therein without departing from the spirit and scope of the invention. Thus, the breadth and scope of the present invention should not be limited by any of the above-described exemplary embodiments, but should be defined in accordance with the following claims and their equivalents.

What is claimed is:

1. A method for repairing defective memory cells of a memory device, the method comprising:
    receiving an access command having an access address and an access operation, the access address including a row address and a column address;
    determining whether the row address and the column address of the access address are the same as a pre-recorded row address and column address of a defective memory cell;
    if the row address and the column address of the access address are the same as the respective row and column addresses of the defective memory cell, finding a redundant memory cell associated with the defective memory cell in response to the access address; and
    executing the access operation using the redundant memory cell.

2. The method of claim 1, further comprising:
    prior to receiving the access command and upon detecting the defective memory cell, recording the row address and the column address of the defective memory cell; and establishing a mapping relationship between the row and column addresses of the defective memory cell and the respective row and column addresses of the redundant memory cell.

3. The method of claim 2, wherein establishing the mapping relationship comprises:
- selecting a redundant memory cell from a row of redundant memory cells that have not been established a mapping relationship with any one of a plurality defective memory cells, the redundant memory cells having a same row address and different columns; and
- establishing a mapping relationship between the row and column addresses of the defective memory cell and the respective row and column addresses of the selected redundant memory cell.

4. The method of claim 3, wherein the column address of the selected redundant memory cell is the same as the column address of the defective memory cell.

5. The method of claim 3, wherein the column address of the selected redundant memory cell is the smallest or the largest column address of the redundant memory cells that have not been established the mapping relationship with any one of the plurality defective memory cells.

6. The method of claim 2, wherein establishing the mapping relationship comprises:
- selecting a redundant memory cell that has not been established a mapping relationship with the defective memory cell from a plurality of rows, each one of the plurality of rows having a plurality of redundant memory cells; and
- establishing a mapping relationship between the row and column addresses of the defective memory cell and the respective row and column addresses of the selected redundant memory cell.

7. The method of claim 1, wherein the access operation comprises a read operation or a write operation.

8. An apparatus for repairing a defective memory cell, the apparatus comprising:
- a receiving unit configured to receive an access command including an access address and an access operation, the access address having a row address and a column address;
- a determining unit configured to determine whether the row address and the column address of the access address are the same as a pre-recorded row address and a pre-recorded column address of a defective memory cell, respectively; and
- an executing unit configured to:
- find a redundant memory cell in response to the access address after determining that the row and column addresses of the access address are the same as the pre-recorded row and column addresses of the defective memory cell, and
- execute the access operation with the redundant memory cell.

9. The apparatus of claim 8 further comprising:
- a setup unit configured to detect the defective memory cell and record the row and column addresses of the defective memory cell and establish a mapping relationship between the row and column addresses of the defective memory and respective row and column addresses of the redundant memory cell before the receiving unit receives the access command.

10. The apparatus of claim 9, wherein the setup unit comprises:
- a selecting module configured to select from a plurality of redundant rows a redundant memory cell that has not been established a mapping relationship with any one of a plurality of defective memory cells, each one of the plurality of redundant rows having a plurality of redundant memory cells, each one of the redundant memory cells on a same redundant row having a different column address; and
- a setup module configured to establish a mapping relationship between the row and column addresses of the defective memory cell and the row and column addresses of the selected redundant memory cell.

11. A volatile memory device comprising:
- an array of memory cells arranged into a number of rows and a number of columns and partitioned into a plurality of groups of memory cells, each group including a plurality of redundant memory cells arranged in a number of redundant columns;
- an address decoding unit configured to decode received address data and select a row of memory cells in response to a decoded address;
- a plurality of multiplexers, each one coupled to one of the plurality of groups; and
- a column address re-allocation unit configured to replace a column address of a defective memory cell with one column address of the plurality of redundant memory cells;
- wherein the redundant memory cells are disposed on a redundant row and the number of redundant columns is equal to the number of columns of the array of memory cells.

12. The volatile memory device of claim 11, wherein each group comprises N columns and each multiplexer comprises N inputs coupled to the N columns, N being an integer and equal to a power of two of a number of select lines of the column address re-allocation unit.

13. The volatile memory device of claim 11, wherein a number of the plurality of redundant memory cells is substantially equal to a number of defective memory cells.

14. The volatile memory device of claim 11, wherein the column address of the defective memory cell is mapped to a same column address of a redundant memory cell.

15. The volatile memory device of claim 11, wherein the column address of the defective memory cell is mapped to a different column address of a redundant memory cell.

16. The volatile memory device of claim 11 further comprising a plurality of flags, each of the flags being associated with a redundant memory cell and configured to indicate an availability of the associated redundant memory cell.

\* \* \* \* \*